United States Patent
Gupta et al.

(10) Patent No.: US 7,640,522 B2
(45) Date of Patent: Dec. 29, 2009

(54) METHOD AND SYSTEM FOR PLACING LAYOUT OBJECTS IN A STANDARD-CELL LAYOUT

(75) Inventors: Puneet Gupta, Santa Clara, CA (US);
Andrew B. Kahng, Del Mar, CA (US);
Chul-Hong Park, San Diego, CA (US)

(73) Assignee: Tela Innovations, Inc., Campbell, CA (US)

( * ) Notice: Subject to any disclaimer, the term of this patent is extended or adjusted under 35 U.S.C. 154(b) by 187 days.

(21) Appl. No.: 11/331,605

(22) Filed: Jan. 14, 2006

(65) Prior Publication Data

US 2007/0168898 A1 Jul. 19, 2007

(51) Int. Cl.
*G06F 17/50* (2006.01)
*G03F 1/00* (2006.01)

(52) U.S. Cl. .................. 716/9; 716/3; 716/4; 716/5; 716/21; 430/5

(58) Field of Classification Search ............ 716/1–5, 716/9, 19, 21; 430/5; 257/48
See application file for complete search history.

(56) References Cited

U.S. PATENT DOCUMENTS

| | | | |
|---|---|---|---|
| 6,421,820 B1 * | 7/2002 | Mansfield et al. | 716/21 |
| 7,132,203 B2 * | 11/2006 | Pierrat | 430/5 |
| 7,155,689 B2 * | 12/2006 | Pierrat et al. | 716/4 |
| 7,227,183 B2 * | 6/2007 | Donze et al. | 257/48 |
| 7,231,628 B2 * | 6/2007 | Pack et al. | 716/19 |
| 7,252,909 B2 * | 8/2007 | Shin et al. | 430/5 |
| 7,302,651 B2 * | 11/2007 | Allen et al. | 716/3 |
| 7,353,492 B2 * | 4/2008 | Gupta et al. | 716/19 |
| 7,484,197 B2 * | 1/2009 | Allen et al. | 716/10 |
| 2005/0132306 A1 * | 6/2005 | Smith et al. | 716/1 |
| 2005/0251771 A1 * | 11/2005 | Robles | 716/5 |
| 2005/0268256 A1 * | 12/2005 | Tsai et al. | 716/4 |
| 2006/0147815 A1 * | 7/2006 | Melvin | 430/5 |
| 2006/0206854 A1 * | 9/2006 | Barnes et al. | 716/21 |
| 2007/0038973 A1 * | 2/2007 | Li et al. | 716/21 |
| 2007/0074145 A1 * | 3/2007 | Tanaka | 716/21 |
| 2007/0209029 A1 * | 9/2007 | Ivonin et al. | 716/19 |
| 2008/0163141 A1 * | 7/2008 | Scheffer et al. | 716/5 |

OTHER PUBLICATIONS

Gupta P., Kahng A.B. and Park C.-H, "Detailed Placement for Improved Depth of Focus and CD Control", Proc. Asia and South Pacific Design Automation Conf., Jan. 2005, pp. 343-348.
Gupta P., Kahng A.B. and Park C.-H,"Enhanced resist and etch CD control by design perturbation", Proc. 25th BACUS Symposiumon on PhotomaskTechnology and Management, Oct. 2005, Yet to be published.

* cited by examiner

*Primary Examiner*—Helen Rossoshek
(74) *Attorney, Agent, or Firm*—Martine Penilla & Gencarella, LLP

(57) ABSTRACT

A method and system for detailed placement of layout objects in a standard-cell layout design are disclosed. Layout objects comprise cells and etch dummies. The method includes a programming based technique to calculate layout object perturbation distances for the layout objects. The method includes adjusting the layout objects with their corresponding layout object perturbation distances. This leads to improved photolithographic characteristics such as reduced Critical Dimension (CD) errors and forbidden pitches in the standard-cell layout.

42 Claims, 10 Drawing Sheets

METHOD AND SYSTEM FOR PLACING LAYOUT OBJECTS IN A STANDARD-CELL LAYOUT

BACKGROUND OF THE INVENTION

1. Field of the Invention

This invention relates generally to standard-cell layout designs, and more particularly, to a dynamic system and method for adjustment of the placement of layout objects, such as the cells and etch dummies used with standard-cell layout designs.

2. Description of the Related Art

The feature size of modern standard cell-based layout designs of integrated circuits has reached nanometer scale. For example, the feature size of leading optical lithographic processes is significantly smaller than that of the wavelength of the light used, resulting in a "sub-wavelength lithography" regime. This requires advanced photomasks that embody one or more resolution enhancement techniques (RETs) such as optical proximity correction (OPC), phase shift masks (PSM), off-axis illumination (OAI), and the insertion of sub-resolution assist features (SRAFs). These techniques achieve enhanced critical dimension (CD) control in photo and etch processes. Further, the resolution of the lithographic process is also improved.

A standard-cell layout comprises a plurality of features. This plurality of features can include a plurality of polysilicon lines, active-layer shapes and added features. The plurality of polysilicon lines and active-layer shapes form a plurality of cells in the standard-cell layout. A polysilicon line can be a gate polysilicon shape, a field polysilicon shape and a wiring polysilicon shape. A gate polysilicon shape is formed with an overlapping of a polysilicon line and an active-layer shape. Extra added features include SRAFs and etch dummies. SRAFs typically are scattering bars which are extremely narrow lines, placed adjacent to primary patterns, that do not actually print on the wafer but affect the pattern of light passing through a photo mask on which they are printed. Traditionally, the features are arranged in a horizontal plane in a plurality of rows. The features are oriented vertically in the plurality of rows. A center-to-center distance between two features is termed as a pitch.

With OAI, the illumination is made to fall on the mask at an oblique angle. This angle is chosen to enhance the photolithographic characteristics of the most common pitches in the standard-cell layout. When off-axis illumination is optimized for one pitch (usually the minimum or the most commonly used pitch in the design), there will always be other pitches for which angle of illumination and angle of diffraction together lead to a poor lithographic response and hence a small depth of focus/process window. These pitches are known as forbidden pitches as it is best to avoid them in the layout. Typically they are defined as pitches for which CD has more than 10% error at the worst-case defocus. Avoiding forbidden pitches is a major task involved in designing a standard-cell layout.

SRAFs, as noted above, are dummy geometries that are inserted as a part of an RET flow, to make the isolated pitches "appear" dense, thereby improving the printability of the otherwise forbidden pitches. The correct placement of SRAFs is a major concern involved in the RET of layouts. Incorrect placement of SRAFs can result in unwanted printing of SRAFs on the wafer. It is necessary to maintain a certain minimum spacing between SRAFs and polysilicon shapes as well as between pairs of SRAFs. At the same time, large spacing can make the SRAFs less effective in helping with printability.

Another method of enhancing CD control during photolithography and the etching process is to insert etch dummies during the preparation of standard-cell layouts. In etch processes, different consumptions of etchants with different pattern density lead to etch skew between dense and isolated patterns. Typically, all available etchants in areas with low density are consumed rapidly, and thus the etch rate drops off significantly. To reduce this etch skew, etch dummies are inserted adjacent to the primary pattern with specific spacing. Furthermore, etch dummies are placed outside of active-layer regions. Therefore, etch dummies require correct placement to make printability of resist and etch processes better. However, the insertion of etch dummies and SRAFs together requires precise spacing. Examples of such spacing include the spacing between etch dummies, between polysilicon shapes and SRAFs, and between active-layer shapes and etch dummies. Incorrect etch dummy placement does not allow SRAF insertion in forbidden pitches even when there is enough space to insert multiple SRAFs before etch dummy insertion. Thus, forbidden pitches, resist CD and etch CD degradations occur due to incorrect spacing between various features in a standard-cell layout, including cells, etch dummies, and SRAFs.

There are a number of methods for the reduction of forbidden pitches and resolution enhancement. Some of these techniques are based on the control of certain optical conditions, such as a numerical aperture (NA) and an illuminator aperture shape for OAI. Neglecting SRAFs during layout preparation requires precise sizing of SRAFs and the proper adjustment of the exposure dose. This results in an increase in the complexity of mask inspection, and possibly to CD degradation.

Therefore, there is a need for a method and system that can place layout objects and SRAFs correctly in a standard-cell layout to reduce forbidden pitches. The method and system should result in enhanced CD control in photo and etch processes. Furthermore, the running time of an OPC should not increase substantially.

SUMMARY OF THE INVENTION

An object of the invention is to place one or more layout objects correctly within a given standard-cell layout, to reduce forbidden pitches.

Another object of the invention is to enhance critical dimension (CD) control in photo and etch processes.

Yet another object of the invention is to introduce additional sub-resolution assist features (SRAFs) and etch dummies in a standard-cell layout, to reduce the CD skew of photo and etch processes and achieve an improvement in wafer printability.

The present invention provides a method and system for the detailed placement of a layout object in a standard-cell layout design. The layout object is either a cell, an etch dummy, or an SRAF. The method calculates the layout object perturbation distance of the layout object, and adjusts the location of the layout object according to the calculated layout object perturbation distance.

The system includes a placement perturbation module and a standard-cell layout generator. The placement perturbation module calculates the layout perturbation distance of the layout object to reduce CD errors. The standard-cell layout generator module adjusts the locations of the layout objects by means of the layout perturbation module.

BRIEF DESCRIPTION OF THE DRAWINGS

So that the above-recited features of the present invention can be understood in detail, a more particular description of the invention, briefly summarized above, may be had by reference to various embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE INVENTION

Various embodiments of the present invention relate to a method and system for detailed placement of layout objects in a standard-cell layout design. A standard-cell layout generated in accordance with various embodiments of the present invention can be used to prepare a photolithography mask that offers improved lithographic characteristics. The lithographic mask can then be used to manufacture an integrated circuit. Layout objects are design objects that need to be positioned in a standard-cell layout design according to specific rules. Layout objects include traditional design objects such as cells. Typically, placement of a cell is chosen by a physical design tool. Exemplary physical design tools include Astro™ from Synopsys and SOC Encounter™ from Cadence. Each cell can further include a plurality of polysilicon shapes and their active-layer shapes. Each of the plurality of polysilicon shapes can include a plurality of gate polysilicon shapes (that is to say, transistor gates) and field polysilicon shapes. Layout objects can also include etch dummies. Etch dummies are added into the standard-cell layout design to reduce the CD skew between the photo and etch processes. Typically, placement of etch dummies is chosen by Resolution Enhancement Technique (RET) tools. Exemplary RET tools include Calibre™ from Mentor Graphics and Proteus™ from Synopsys. Traditionally, etch dummies are placed after the placement of cells. Further, sub-resolution assist features (SRAFs) are also inserted in the standard-cell layout, usually after the placement of etch dummies. SRAFs enhance the printability of isolated patterns onto the wafer. The placement of SRAFs in the standard-cell layout involves possible spacing constraints. Incorrect placement of SRAFs can result in the occurrence of forbidden pitches in the standard-cell layout, as well as unwanted printing of SRAFs on the wafer. Forbidden pitches are those pitches for which the process window of Critical Dimension (CD) is too small.

Inserting etch dummies with SRAFs necessitates additional spacing constraints. Examples of additional spacing constraints include spacing between active-layer shapes, between polysilicon shapes, and between polysilicon shapes and etch dummies. These additional spacing constraints can be different for the SRAFs and etch dummies.

Figure 1:
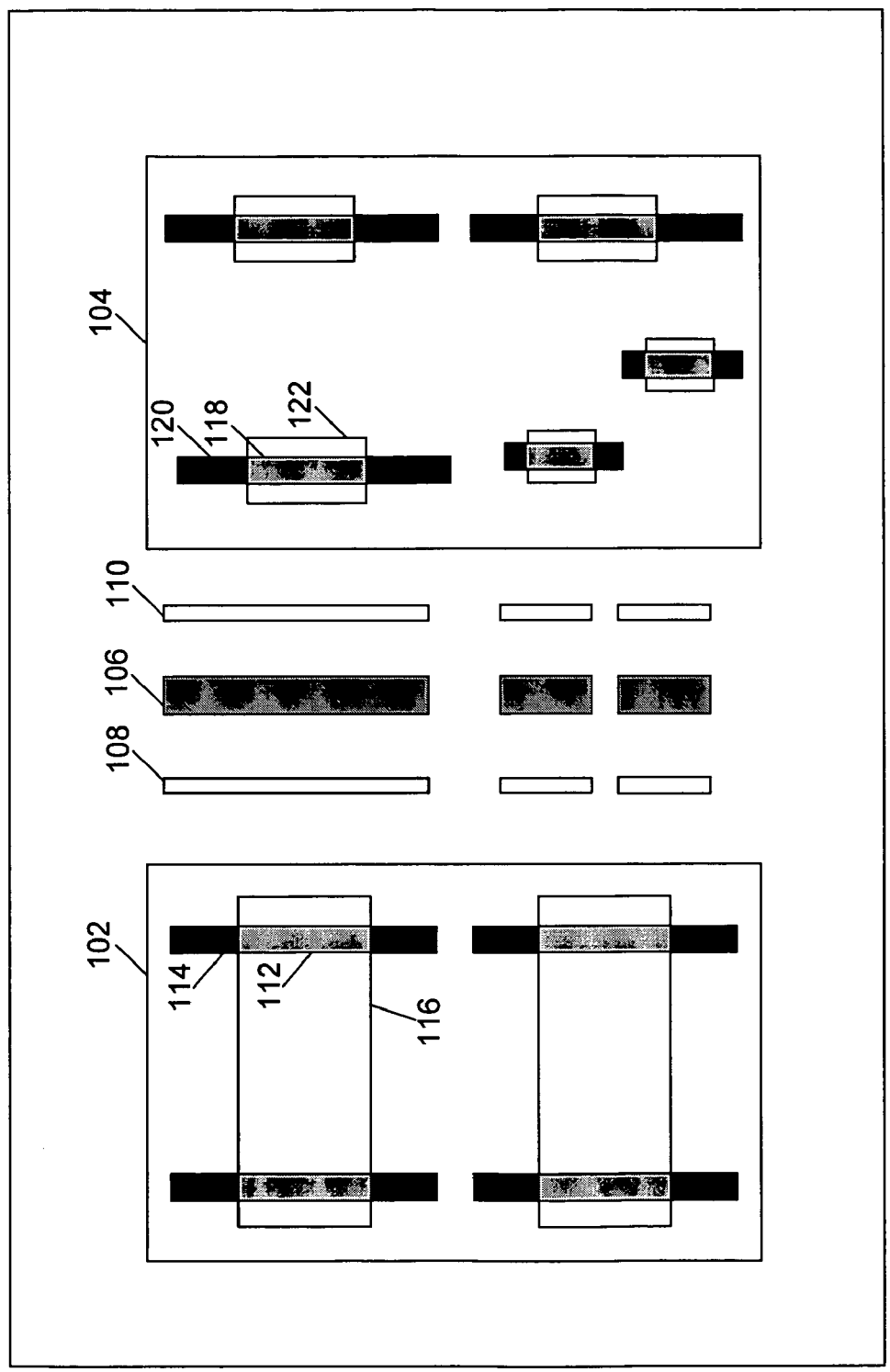
FIG. 1 is a schematic diagram illustrating exemplary elements of a standard-cell layout.

FIG. 1 is a schematic diagram illustrating exemplary elements of a standard-cell layout. The standard-cell layout includes a plurality of layout objects and sub-resolution assist features (SRAFs). The plurality of layout objects and SRAFs are placed in the same plane as shown in FIG. 1. Examples of layout objects include, but are not limited to, cells and etch dummies. In an embodiment of the present invention, the cells are arranged in a plurality of rows in the standard-cell layout. The exemplary standard-cell layout shown in FIG. 1 includes a cell 102, a cell 104, an etch dummy 106, an SRAF 108, and an SRAF 110. It will be apparent to those skilled in the art that the standard-cell layout can also include other similar components, as shown in FIG. 1. Cells in a standard-cell layout can include polysilicon and active-layer shapes. Polysilicon shapes further include gate polysilicon shapes (polysilicon over active-layer shape) and field polysilicon shapes or wiring polysilicon shapes. For example, as shown in FIG. 1, cell 102 includes a gate polysilicon shape 112, a field polysilicon shape 114, an active-layer shape 116, and other polysilicon and active-layer shapes. Similarly, cell 104 includes a gate polysilicon shape 118, a field polysilicon shape 120, an active-layer shape 122, and other polysilicon shapes and active-layer shapes.

Figure 2:
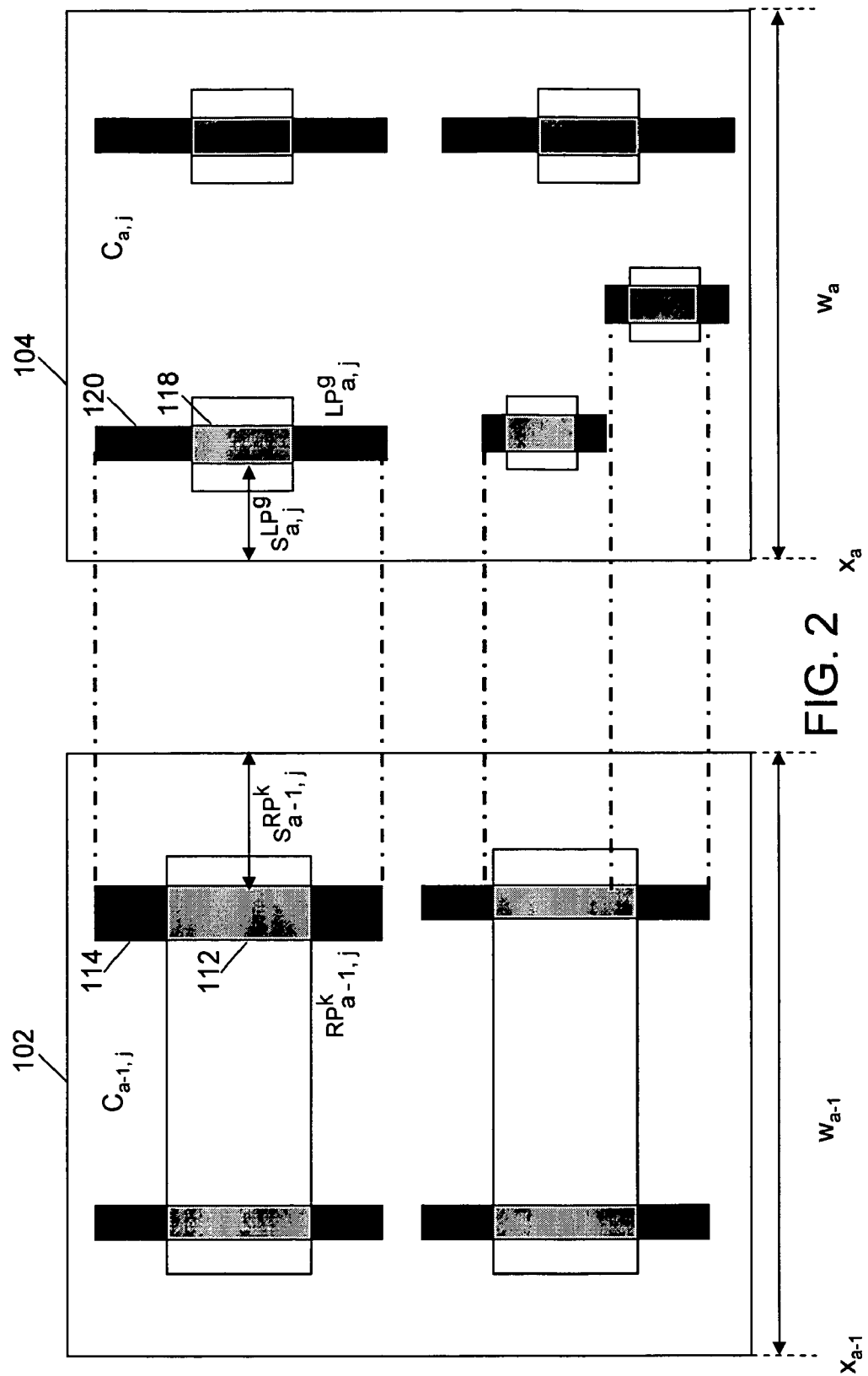
FIG. 2 is a schematic diagram illustrating the interaction between the polysilicon shapes of the horizontally adjacent cells in a standard-cell layout.

FIG. 2 is a schematic diagram illustrating the interaction between the polysilicon shapes of horizontally adjacent cells in a standard-cell layout. Cell 102 and cell 104 are in a cell row. In FIG. 2, the horizontal interactions of the polysilicon shapes of the adjacent cells are shown in one cell row. A section separated by lines (in dashes) represents the interaction between the polysilicon shapes. In a generalized way, $C_{a,j}$ represents the $a^{th}$ cell in the $j^{th}$ row. Similarly, $C_{a-1,j}$ represents the $(a-1)^{th}$ cell in the $j^{th}$ row. In an embodiment of the present invention, only polysilicon shapes with lengths that exceed the minimum length of the SRAFs are considered. Typically, a polysilicon shape that is shorter than the minimum length of the SRAFs has a negligible impact on the photolithographic characteristics of the standard-cell layout. Each cell has an outline boundary enclosing all the polysilicon shapes. The polysilicon shapes can be grouped according to their proximity to the cell's left and right outline. Therefore, there are two groups of polysilicon shapes in a cell when a row is considered. These groups are referred to as a left polysilicon shape group and a right polysilicon shape group. The polysilicon shape of the left polysilicon shape group of a cell can overlap another polysilicon shape of the right polysilicon shape group of an adjacent cell. In FIG. 2, $LP_{a,j}$ represents the left polysilicon shape group and $RP_{a,j}$ the right polysilicon shape group of the $a^{th}$ cell in the $j^{th}$ row. In cell 102, the polysilicon shape formed by gate polysilicon shape 112 and field polysilicon shape 114 is a subset of $RP_{a-1,j}$. Similarly, in cell 104, the polysilicon shape formed by gate polysilicon shape 118 and field polysilicon shape 120 is a subset of $LP_{a,j}$. In general, when there are 'N' polysilicon shapes in the set $RP_{a-1,j}$ where $N \geq 1$, any $k^{th}$ polysilicon shape of the set $RP_{a-1,j}$ can be represented as $RP_{a-1,j}^k$. Similarly, when there are M polysilicon shapes in the set $LP_{a,j}$ and where $M \geq 1$, any $g^{th}$ polysilicon shape of the set $LP_{a,j}$ can be represented as $LP_{a,j}^g$. The distance between the right outline of the cell $C_{a-1,j}$ and $RP_{a-1,j}^k$, can be represented by $S_{a-1,j}^{RP^k}$. Similarly, the distance between the left outline of the cell $C_{a,j}$ and $LP_{a,j}^g$ can be represented by $S_{a,j}^{LP^g}$. Let $W_a$ denote the width of the cell $C_{a,j}$ and $W_{a-1}$ the width of the cell $C_{a-1,j}$. Further, let $X_a$ and $X_{a-1}$ denote the leftmost placement coordinate of the cell $C_{a,j}$ and $C_{a-1,j}$, respectively, corresponding to an origin. For the purpose of this description, co-ordinates increase from the left to the right and from the bottom to the top in FIG. 2.

Figure 3:
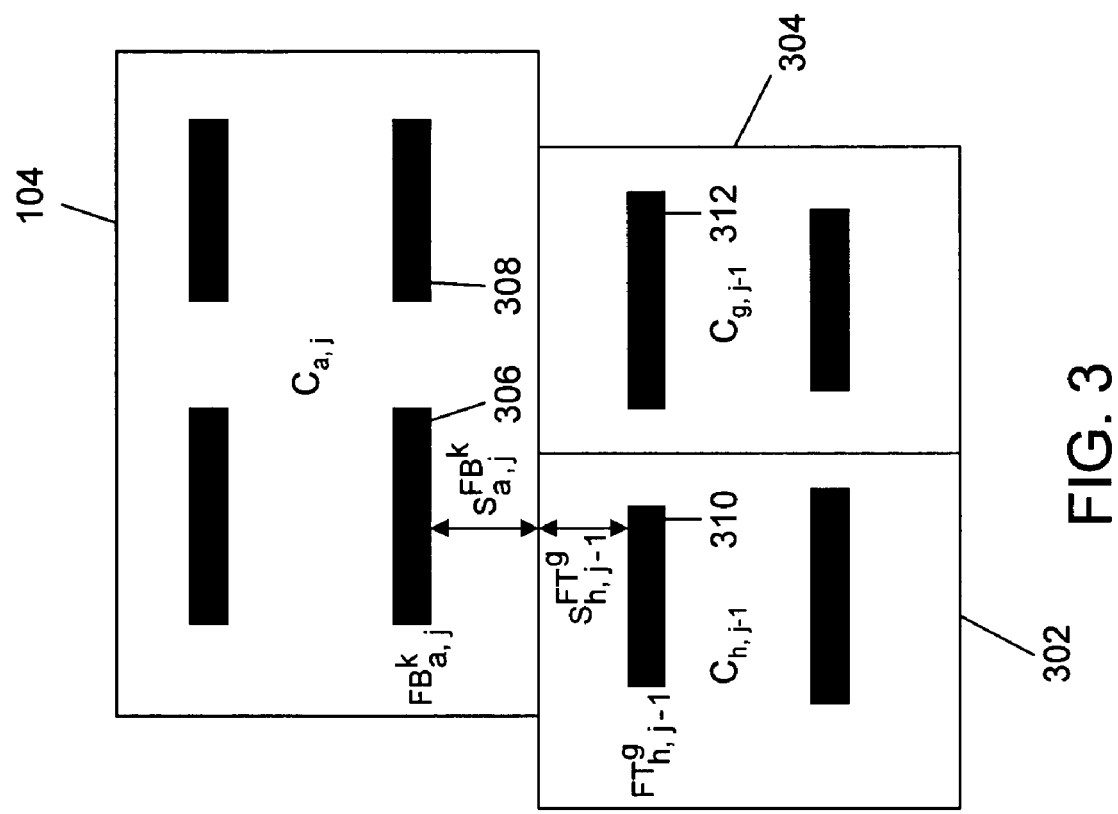
FIG. 3 is a schematic diagram illustrating the interaction between the polysilicon shapes of the vertically adjacent cells in a standard-cell layout.

FIG. 3 is a schematic diagram illustrating the interaction between the polysilicon shapes of the vertically adjacent cells in a standard-cell layout. This schematic diagram represents the vertical interaction of the polysilicon shapes of the different cell rows. In FIG. 3, cell 104, along with cells 302, and 304 are shown. Cells 302 and 304 lie in the same plane as cell 104, as shown in FIG. 1. Cell 104 includes a field polysilicon shape 306 and a field polysilicon shape 308. Cell 302 includes a field polysilicon shape 310. Cells 302 and 304 belong to the same row and cell 104 (as shown in FIG. 1) is in a vertically adjacent row of the same layer. For the purpose of this description, only two rows and three cells are shown in the standard-cell layout. It will be apparent to a person skilled in the art that the standard-cell layout can include many more rows. In the arrangement shown in FIG. 3, there is an interaction between the field polysilicon shapes in adjacent cell rows, since typically, gate polysilicon shapes are placed vertically in the standard-cell layout (the standard cell placement rows oriented horizontally in the plane of FIG. 3). Let cell 104 be the $a^{th}$ cell in a row j of the standard-cell layout. The cell can then be represented as $C_{a,j}$. Similarly, let cells 302 and 304 be the $h^{th}$ and $g^{th}$ cells in an adjacent row, j−1. Then cells 302 and 304 can be represented as $C_{h,j-1}$ and $C_{g,j-1}$. The field (or gate) polysilicon shapes are grouped according to their proximity to a top outline of a cell and a bottom outline of the cell, when the cells in adjacent rows are being considered. These groups are referred to as a top field polysilicon shape group and a bottom field polysilicon shape group. For example, field polysilicon shapes 306 and 308 form the bottom field polysilicon shape group for cell 104. Similarly, field polysilicon shapes 310 and 312 form the top field polysilicon shape groups of cells 302 and 304, respectively. Let $FB_{a,j}^k$ represent the $k^{th}$ field polysilicon shape of a bottom field polysilicon shape group of cell $C_{a,j}$, and $FT_{h,j-1}^g$ denote the $g^{th}$ field polysilicon shape of a top field polysilicon shape group of cell $C_{h,j-1}$. Further, let $S_{a,j}^{FB^k}$ denote the spacing between the bottom outline of the cell $C_{a,j}$ and the bottom of the $k^{th}$ field polysilicon shape of the bottom field polysilicon shape group of the cell $C_{a,j}$. Similarly, lets $s_{h,j-1}^{FT^g}$ denote the spacing between the top outline of the cell $C_{h,j-1}$ and the top of the $g^{th}$ field polysilicon shape of the top field polysilicon shape group of the cell $C_{h,j-1}$.

Figure 4:
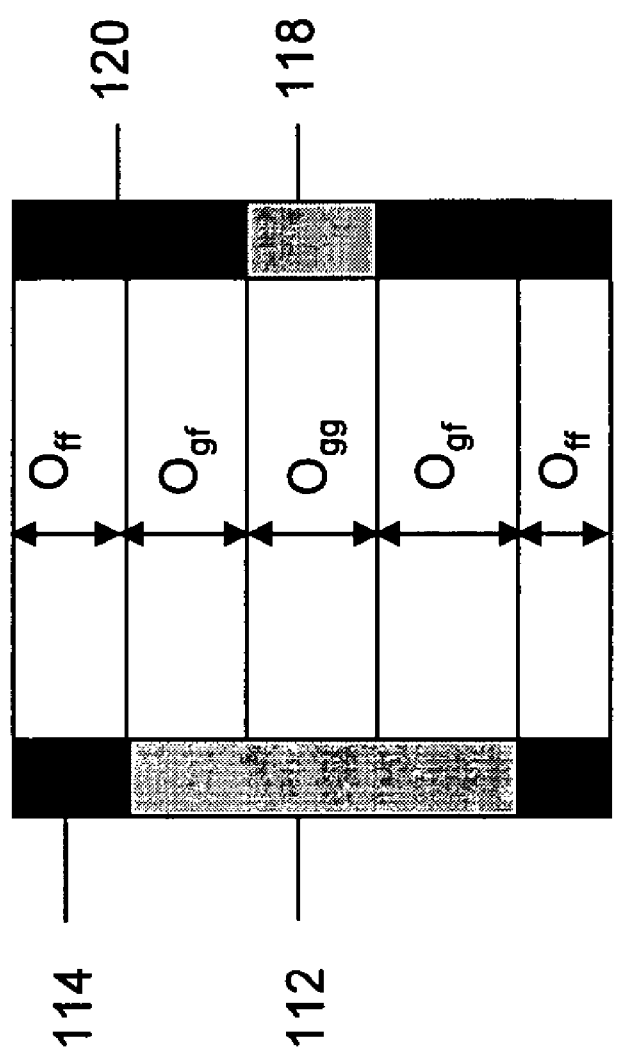
FIG. 4 is a schematic diagram illustrating overlap between polysilicon shapes in adjacent cells.

FIG. 4 is a schematic diagram illustrating overlap between the polysilicon shapes in adjacent cells. This schematic diagram represents the overlap between the polysilicon shapes in conjunction with FIG. 2. FIG. 4 shows the polysilicon shape formed by gate polysilicon shape 112 and field polysilicon shape 114, and another polysilicon shape formed by gate polysilicon shape 118 and field polysilicon shape 120. Let $O_{gg}$ denote the length of the overlap between gate polysilicon shape 112 and gate polysilicon shape 118. Further, let $O_{gf}$ denote the length of the overlap between gate polysilicon shape 112 and field polysilicon shape 120. As shown in FIG. 4, $O_{gf}$ has two components on either side of $O_{gg}$ which are summed to give the value of $O_{gf}$. Similarly, let $O_{ff}$ denote the length of the overlap between field polysilicon shape 114 and field polysilicon shape 120. As shown in FIG. 4, $O_{ff}$ has two components on either side of $O_{gf}$ which are summed to give the value of $O_{ff}$. To enhance CD control and reduce forbidden pitches in the standard-cell layout described in conjunction with FIGS. 2, 3 and 4, a detailed placement of layout objects is required.

Figure 5:
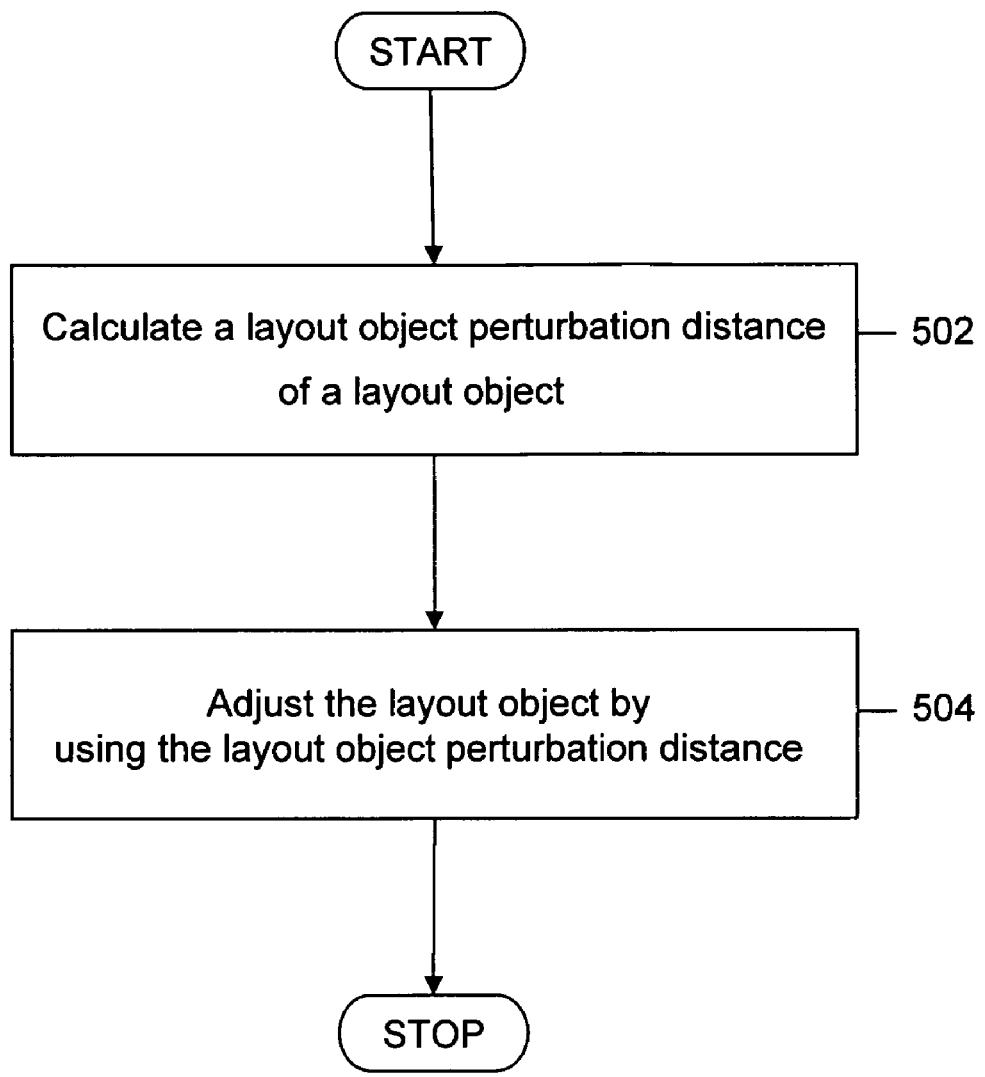
FIG. 5 is a flowchart illustrating a method for detailed placement of a layout object in a standard-cell layout design, in accordance with an embodiment of the present invention.

FIG. 5 is flowchart depicting a method for detailed placement of a layout object in a standard-cell layout design, in accordance with an embodiment of the present invention. At step 502, a layout object perturbation distance, that is, the change in spacing of a layout object is calculated. If the layout object is a cell, its layout object perturbation distance is calculated along with an overall layout perturbation distance for a set of cells. In an embodiment of the present invention, the set of cells comprises all the cells in the cell row. The overall layout perturbation distance between a set of cells is a summation of the layout perturbation distance of each of the set of cells. The calculation of the layout perturbation distance given above can be based on the calculation of a cost function. The cost function quantifies the cost of placing a cell at a particular placement site in the cell row. In order to reduce CD degradation, the cost function has to be minimized. The cost function of a set of cells is minimized to determine the layout object perturbation distance of each cell. For example, a particular layout object perturbation distance may result in the removal of forbidden pitches from a cell, but may lead to excessive overlap between polysilicon shapes of cells in adjacent rows. This layout object perturbation distance would then reduce the lithographic characteristics of the standard-cell layout. Minimizing the cost function ensures that the layout object perturbation distances for all cells are such that the overall lithographic characteristics of the standard-cell layout are improved. At step 504, the layout object is adjusted according to the layout object perturbation distance.

When the method illustrated in FIG. 5 is followed for each cell in a set of cells in a standard-cell layout, the spacing between the cells is adjusted such that forbidden pitches are reduced. Therefore, a dynamic programming-based approach for the detailed placement of layout objects is followed, to ensure assist-feature correction. In an embodiment of the present invention, the forbidden pitches include horizontal (H) forbidden pitches and vertical (V) forbidden pitches. H-forbidden pitches occur between the cells in a row and V-forbidden pitches between the cells of vertically adjacent rows. The vertical and horizontal pitches occur in the same plane. Cells are adjusted such that spacings between the cells are one of a set of assist-correct spacings (AF). Assist-correct spacings are the required spacings between two layout shapes which allow for inserting a sufficient number of SRAFs to attain a threshold level of printing quality/process window. AF includes a plurality of assist-correct spacings or $AF = AF_1 \ldots AF_m$. Let $AF_l$, denote the $l^{th}$ member of the set AF, where $AF_m > AF_l > AF_1$ and $m > l > 1$. If the spacing between the polysilicon shapes is equal to an assist-correct spacing, then the required number of sub-resolution assist features (SRAFs) can be inserted between the cells. A perturbation of spacing $(\delta_{a,j})$ is calculated for assist-correct placement, where $\delta_{a,j}$ represents the spacing perturbation of cell $C_{a,j}$. At the same time, in an embodiment of the present invention, an overall layout perturbation distance for the cell row, is also calculated and minimized. The assist-feature correction problem can be represented as:

$$\text{Minimize } \Sigma |\delta_{a,j}|$$

As shown in FIG. 2, the polysilicon shape formed by gate polysilicon shape 112 and field polysilicon shape 114 and the polysilicon shape formed by gate polysilicon shape 118 and field polysilicon shape 120 overlap horizontally in a cell row.

To make the spacing between these two polysilicon shapes into an assist-correct spacing, the following criteria should be satisfied:

$$(\delta_{a,j}+x_{a,j}+S_{a,j}^{LP^g})-(\delta_{a-1,j}+x_{a-1,j}+w_{a-1,j}-S_{a-1,j}^{RP^k}) \in AF$$

Similarly, in FIG. 3, field polysilicon shapes 306 and 310 and field polysilicon shapes 308 and 312 overlap each other vertically. To make the spacing between field polysilicon shapes 306 and 310 into an assist-correct spacing, the following criteria should be satisfied:

$$S_{a,j}^{FB^k}+S_{h,j-1}^{FT^g} \in AF$$

In another embodiment of the present invention, the above-mentioned problem is solved by calculating a cost function by considering a set of cells, where cost (a, b) is the cost of placing a cell 'a' at a placement site number 'b'. In any standard cell layout, there is a plurality of placement sites where a layout object can be placed. The numbering of placement sites is indexed from left to right, corresponding to an origin. In an embodiment of the present invention, there are two types of cost functions that are determined: H cost (a, b), which is the cost penalty of placing a cell 'a' at placement site number 'b' in the same row, and is associated with its neighbor cell $C_{a-1}$ in the same row. The cost penalty has two components: (1) printability or CD error cost and (2) perturbation cost. The first penalty comes from SRAFs and Etch dummy correctness. The second comes from other design concerns such as timing, routability and the like. In general, the less the location of a cell is perturbed, the better, as it was placed at a given location by a placement tool to improve certain design metrics such as timing, wirelength, etc. Similarly, V cost (a, b) is the cost of placing the cell 'a' at a placement site number 'b' in the same row, and is associated with its vertical field polysilicon shape interactions with adjacent cells in adjacent rows. The dynamic programming-based approach for assist-feature correction takes the first cell in a cell row and calculates the cost function of the first cell. Subsequently, the next cell adjacent to the first cell is taken, and the cost function for this cell is calculated in a recursive fashion. In this way, the cost functions of each cell in the cell row are calculated.

Therefore, the assist-feature correction problem can be solved by using the following cost function:

$$\text{Cost}(1, b) = |x_1 - b|$$

$$\text{Cost}(a, b) = \lambda(a)|x_a - b| + \text{Min}_{i=x_{a-1}-srch}^{x_{a-1}+srch} \begin{Bmatrix} \text{Cost}(a-1, i) + \alpha H \text{ cost}(a, b, a-1, i) + \\ \beta V \text{ cost}(a, b) \end{Bmatrix}$$

where α and β are the relative importance of H cost and V cost. H cost is related to the overlap between the gate polysilicon shapes and the printability of a polysilicon shape, which directly affects the device performance. Typically V cost influences only the field poly-silicon geometries and so it is less important. Thus, in an embodiment of the present invention, H cost has more weight (α>β) than V cost. In other situations it can have increased importance due to, for example, constraints of the lithographic equipment which may be better at printing vertical shapes than horizontal ones. λ is a term that is associated with the relative importance of preserving the initial location of a cell in the standard cell layout. Therefore, λ(a) $|x_a-b|$ is a measure of the cost required to changing the position of the cell. For example, if there are numerous critical timing paths that pass through a particular cell, the placement of the cell should not be changed. Hence, the value of λ should be kept high. In an embodiment of the invention, λ is kept directly proportional to the number of critical timing paths that pass through a cell.

In another embodiment of the invention, the maximum perturbation of a cell is also limited. Let SRCH denote the number of neighboring placement sites by which a cell can be adjusted. The range of the cell $C_{a,j}$ in which it can be adjusted is the range of placement site ($X_{a-1}$−SRCH, $X_{a-1}$+SRCH). This restricts the perturbation of a cell to a maximum of ±SRCH placement sites from its initial location, to limit the maximum perturbation of any cell and also reduce the runtime of the algorithm.

The following is an exemplary pseudo code for calculating the H cost:

Input:

$C_{ff}$ is a user-defined weight for overlapping field polysilicon shapes;

$C_{gg}$ is a user-defined weight for overlapping gate polysilicon shapes;

$C_{gf}$ is a user-defined weight for overlapping gate polysilicon shapes and field polysilicon shapes;

b is a left coordinate of cell $C_{a,j}$;

i is a left coordinate of cell $C_{a-1,j}$;

$w_a$ is the width of cell $C_{a,j}$;

$w_{a-1}$ is the width of cell $C_{a-1,j}$;

Hspace (k, g) is the horizontal spacing between $RP_{a-1,j}^k$ and $LP_{a,j}^g$;

$O_{gg}$ (k, g) is the length of the overlap between polysilicon gates of $RP_{a-1,j}^k$ and $LP_{a,j}^g$;

$O_{gf}$(k, g) is the length of the overlap between a gate polysilicon shape and a field polysilicon shape of $RP_{a-1,j}^k$ and $LP_{a,j}^g$;

$O_{ff}$(k, g) is the length of the overlap between field polysilicon shapes of $RP_{a-1,j}^k$ and $LP_{a,j}^g$; and Slope (j) is the degradation of CD with respect to pitch, when the spacing between the two polysilicon shapes is between $AF_l$, and $AF_{l+1}$, that is, the ratio ΔCD/Δspacing.

Output:

Value of H cost (a, b, a−1, i)

Algorithm:

```
01. Case a =1: H cost (1, b) = 0
02. Case a>1 Do
03.   N: = cardinality of set RP_{a-1,j} right polysilicon shape group of cell C_{a-1,j}
04.   M: = cardinality of set LP_{a,j} left polysilicon shape group of cell C_{a,j}
05.   For (k = 1; k = N; k = k + 1){
06.     For (g = 1; g = M; g = g + 1){
        /* Calculate overlap weight between RP_{a-1,j}^k and LP_{a,j}^g */
07.       Weight (k, g) = slope (j)*(Hspace (k, g) − AF_l)*(C_{ff}O_{ff}(k, g) + C_{gf}O_{gf}(k, g) + C_{gg}O_{gg}(k, g))
08.       H cost (a, b, a−1, i) = H cost (a, b, a−1, i) + weight (k, g)
      }}
```

The term slope (j)*(Hspace (k, g)−$AF_l$) is a measure of the variation of CD between the polysilicon shapes. The term ($C_{ff}O_{ff}$(k, g)+$C_{gf}O_{gf}$(k, g)+$C_{gg}O_{gg}$(k, g)) is a first overlapping factor that accounts for a gate polysilicon shape-to-polysilicon gate overlap, a gate polysilicon shape-to-field polysilicon shape overlap, and a field polysilicon shape-to-field polysilicon shape overlap. $C_{ff}$, $C_{gf}$, and $C_{gg}$ are used to weigh the overlap based on the printability of the gate polysilicon shapes and field polysilicon shapes.

Similarly, the following is an exemplary pseudo code for calculating the V cost (a, b):

Input:

$C_{ff}$ is a user-defined weight for overlapping field polysilicon shapes.

b is a left coordinate of cell $C_{a,j}$.

Vspace is the vertical spacing between $FT_{h,j-1}{}^g$ and $FB_{a,j}{}^k$.

$O_{ff}(k, g)$ is the length of the overlap between field polysilicon shapes of $FT_{h,j-1}{}^g$ and $FB_{a,j}{}^k$.

Output:

Value of V Cost (a, b)

Algorithm:

```
01. Case j =1: V cost(a, b) = 0
02. Case j > 1 Do
03. Determine M: = the number of field polysilicon shapes in the bottom
    field polysilicon shape group of cell C_{a,j}
04. Determine N: = number of field polysilicon shapes in the top field
    polysilicon shape group of cell C_{a,j}.
05. Determine L: leftmost cell overlapping C_{a,j} in row j
06. Determine R: rightmost cell overlapping C_{a,j} in row j
07. For (k = 1; k = M; k = k + 1) {
08.   For (h = L; h = R; h = h + 1){
09.     For (g = 1; g = N; g = g + 1){
10.       Vspace (a, b, g, h, k) = S_{a,j}^{FB^k} + S_{h,j-1}^{FT^g}
11.       weight (k, g) = slope (j)*(Vspace (a, b, g, h, k) -
          AF_l)*(C_{ff}O_{ff}(k, g))
          Where AF_l ≤ Vspace (a, b, g, h, k) ≤ AF_{l+1}
12.       V cost (a, b) = V cost (a, b) + weight (k, g)
}}}
```

Figure 6:
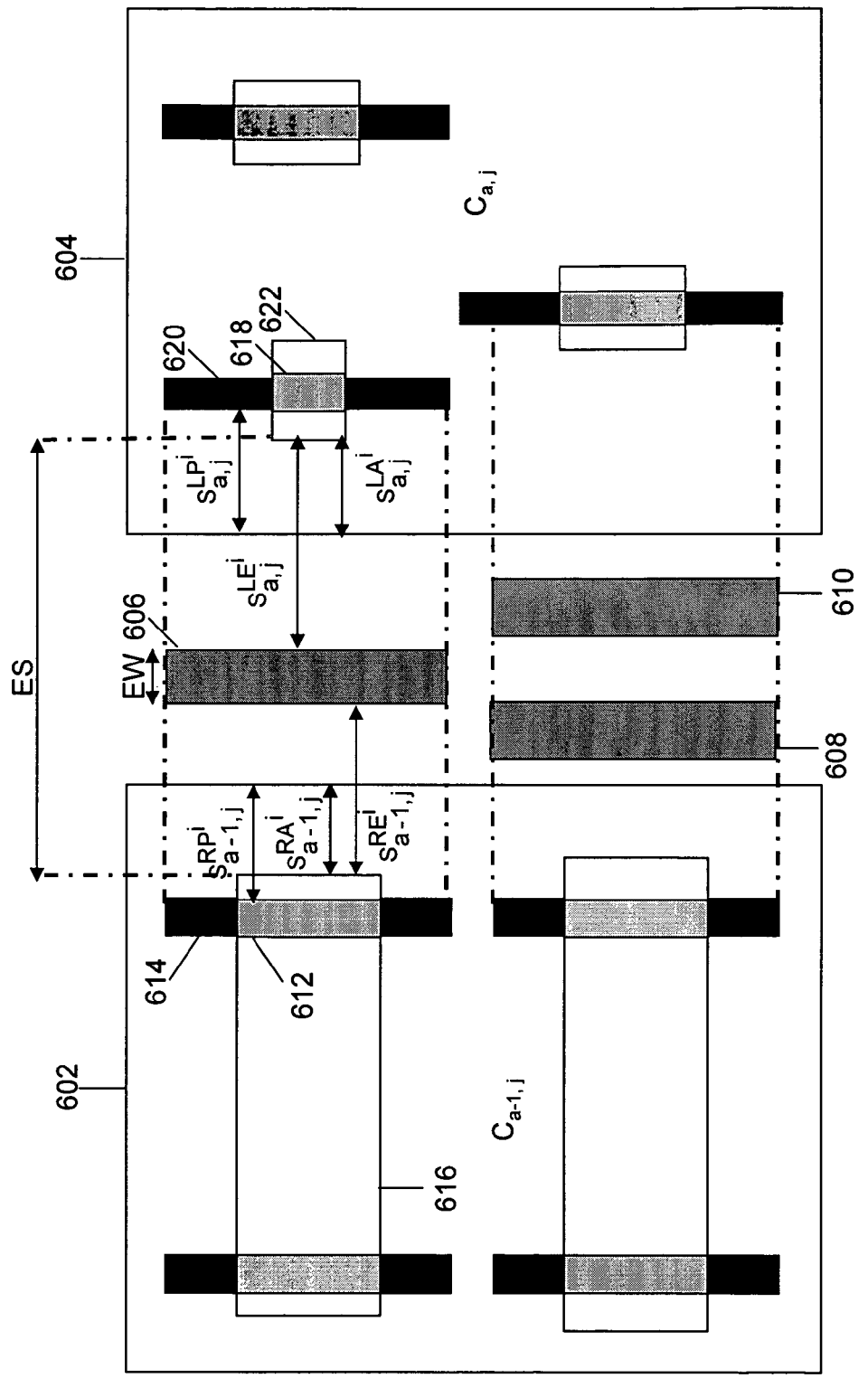
FIG. 6 is a schematic diagram illustrating the interaction between polysilicon shapes and etch dummies in a row in a standard-cell layout.

FIG. 6 is a schematic diagram illustrating the interaction of the polysilicon shapes and etch dummies in a row in a standard-cell layout. Etch dummies are added in the layout to reduce the etch skew between the photo and etch processes in a standard-cell layout design. These etch dummies are placed outside the active-layer shapes. However, the insertion of etch dummies conflicts with the insertion of SRAFs in the standard-cell layout as their particular spacing requirement within the standard cell layout. Typically, two etch dummies are considered sufficient between two polysilicon shapes. In FIG. 6, a cell 602, a cell 604, an etch dummy 606, an etch dummy 608, and an etch dummy 610 are shown. Cell 602 and cell 604 are in one cell row. For the purpose of this description, only cells 602 and 604 are shown, but it will be apparent to those skilled in the art that the cell row can also include other cells. In FIG. 6, horizontal interaction between the polysilicon shapes of adjacent cells and etch dummies are shown in a row. A section marked by lines (in dashes) represents the interaction between the polysilicon shapes and etch dummies. Cell 602 includes a polysilicon shape, shown by a combination of a gate polysilicon shape 612 and a field polysilicon shape 614 and an active-layer shape 616. Similarly, cell 604 includes a polysilicon shape, shown by a combination of a gate polysilicon shape 618 and a field polysilicon shape 620 and an active-layer shape 622. Let $s_{a-1,j}{}^{RP^i}$ denote the spacing between the right outline of the cell $C_{a-1,j}$ and the $i^{th}$ polysilicon shape of the right polysilicon shape group of cell $C_{a,j}$. Similarly, let $s_{a,j}{}^{LP^i}$ denote the spacing between the left outline of the cell $C_{a,j}$ and the $i^{th}$ polysilicon shape of the left polysilicon shape group of cell $C_{a,j}$. Let $s_{a-1,j}{}^{RA^i}$ denote the spacing between the right outline of the cell $C_{a-1,j}$ and the $i^{th}$ active-layer shape of the cell $C_{a-1,j}$, where the active-layer shape belongs to the right polysilicon shape group. Similarly, let $s_{a,j}{}^{LA^i}$ denote the spacing between the left outline of the cell $C_{a,j}$ and the $i^{th}$ active-layer shape of the cell $C_{a,j}$, where the active-layer shape belongs to the left polysilicon shape group. Further, let $s_{a-1,j}{}^{RE^i}$ denote the spacing between etch dummy 606 and the active-layer shape of the $i^{th}$ cell of cell $C_{a-1,j}$, where the active-layer shape belongs to the right polysilicon shape group. Similarly, let $s_{a,j}{}^{LE^i}$ denote the spacing between etch dummy 606 and the active-layer shape of $i^{th}$ cell of cell $C_{a,j}$, where the active-layer shape belongs to the left polysilicon shape group. Let ES denote the spacing between the active-layer shapes of the adjacent cell in the $i^{th}$ cell row. Further, $x_a$ and $x_{a-1}$ denote the left coordinates of the cell $C_{a,j}$ and $C_{a-1,j}$ respectively and $w_{a-1}$ denote the width of the cell $C_{a-1,j}$.

Figure 7:
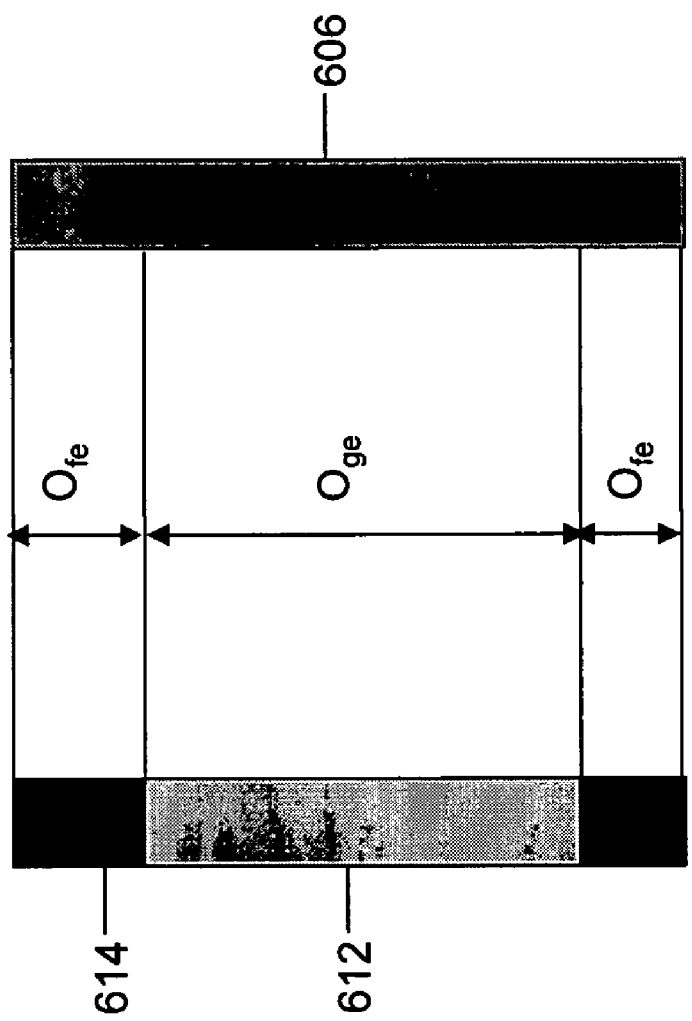
FIG. 7 is a schematic diagram illustrating overlap between an etch dummy and a polysilicon shape.

FIG. 7 is a schematic diagram illustrating overlap between an etch dummy and adjacent polysilicon shapes. FIG. 7 illustrates an overlap between a polysilicon shape formed by gate polysilicon shape 612 and field polysilicon shape 614, and etch dummy 606, as described in conjunction with FIG. 6. Let $O_{ge}$ denote the length of the overlap between gate polysilicon shape 612 and etch dummy 606. Similarly, let $O_{fe}$ denote the length of the overlap between field polysilicon shape 614 and etch dummy 606. As shown in FIG. 7, $O_{fe}$ has two components on either side of $O_{ge}$ that are summed to calculate the value of $O_{fe}$. To enhance CD control and reduce forbidden pitches in the standard-cell layout, described in conjunction with FIGS. 6 and 7, a detailed placement of layout objects is required.

When the method illustrated in FIG. 5 is followed for each cell in a set of cells in standard-cell layout while accounting for etch dummies, the spacing between the cells is adjusted such that forbidden pitches, e.g. the pitch between poly shapes, which can be shapes in a cell or the etch dummy itself, are reduced. The method accounts for both assist-correct spacing and etch dummy-correct spacing. This combined method is referred to as etch dummy correction. This method considers the following spacing:

ES: spacing between the active-layer shapes of adjacent cells in a cell row;

ED1: required spacing between the active-layer shapes of adjacent cells, to insert one etch dummy;

ED2: required spacing between the active-layer shapes of adjacent cells to insert two etch dummies;

DDS: an etch dummy to dummy space in the event of there being two etch dummies;

EW: the width of the etch dummy;

DAS: etch dummy to active-layer-shape spacing;

EDS: a set of etch-correct spacings;

A set of assist-correct spacings AF: $AF=AF_1 \ldots AF_m$.

In an embodiment of the present invention, an etch-correct spacing (EDS) is chosen such that the maximum resist-etch skew is less than the, for example, 10 percent of the minimum line width. The minimum line width can be taken as the width of a pattern of the minimum width in the standard cell layout. In this combined method, a layout perturbation distance is calculated to make the spacing between the polysilicon shapes and that between a polysilicon shape and etch dummy 606 an assist-correct spacing. Further, the spacing between the active-layer shape 616 and the etch dummy 606 is made into an etch-correct spacing. The layout object perturbation distance, or the perturbation of spacing required to adjust the spacing between adjacent cells for the cell $C_{a,j}$ can be denoted by $\delta_{a,j}$. Therefore, the etch dummy correction problem can be represented as:

Minimize $\Sigma|\delta_{a,j}|$ such that

If $(ES<ED1)$, $(\delta_{a,j}+x_a+s_{a,j}{}^{LP^i})-(\delta_{a-1,j}+x_{a-1}+w_{a-1}{}^{-s}{}_{a-1,j}{}^{RP^i})\in AF$ The expression given above ensures that the spacing between the polysilicon shapes is an assist-correct spacing.

$(\delta_{a,j}+x_a+s_{a,j}{}^{LA^i})-(\delta_{a-1,j}+x_{a-1}+w_{a-1}-s_{a-1,j}{}^{RA^i})\in EDS$ The expression given above ensures that the spacing between the active-layer shapes of adjacent cells is an etch-correct spacing where $-SRCH \leq \delta_{a-1,j}$ and $\delta_{a,j} \leq SRCH$, otherwise, $s_{a-1,j}{}^{RP^i}-s_{a-1,j}{}^{RA^i}+s_{a-1,j}{}^{RE^i}+\delta_{a-1,j}$ and $s_{a,j}{}^{LP^i}-s_{a,j}{}^{LE^i}+\delta_{a,j}\in AF$ The expression given above ensures that the spacing between the polysilicon shapes and etch dummy is an assist-correct spacing.

$s_{a-1,j}{}^{RE^i}+\delta_{a-1,j}$ and $s_{a,j}{}^{LE^i}+\delta_{a,j}\in EDS$

The expression given above ensures that the spacing between the active-layer shape and etch dummy 606 is an etch-correct spacing where $-SRCH \leq \delta_{a-1,j}$ and $\delta_{a,j} \leq SRCH$ In an embodiment of the present invention, the method solves the above-mentioned problem by calculating a cost function and minimizing it by considering a set of cells. Cost (a, b) is the cost of placing a cell 'a' at a placement site number 'b'. In an embodiment of the present invention, two cost functions are determined: the AFCost (a, b), which is the cost of placing a cell $C_{a,j}$ at a placement site number 'b' and is associated with its neighbor cell $C_{a-1,j}$, and EDCost (a, b), which is the cost of placing the cell $C_{a,j}$ at a placement site number 'b' and is associated with the etch dummies adjacent to the cell $C_{a,j}$. Etch dummy correction takes the first cell in a cell row and calculates the cost function of the first cell. Subsequently, the next cell is taken and the cost function of this cell is calculated. In this way, the cost function of each cell in the cell row is calculated. An overall cost function is calculated by adding up all the cost functions in the cell row.

The cost function is calculated by the following dynamic programming recurrence:

$$\text{Cost}(1, b) = |x_1 - b|$$

$$\text{Cost}(a, b) = \lambda(a)|x_a - b| + \text{Min}_{i=x_{a-1}-srch}^{x_{a-1}+srch} \left\{ \begin{array}{c} \text{Cost}(a-1, i) + W_1 AFCost(a, b, a-1, i) + \\ W_1 EDCost(a, b, a-1, i) \end{array} \right\}$$

where $W_1$ and $W_2$ are user-defined weights for the AFCost (a, b, a–1, i) and the EDCost (a, b, a–1, I). The value of W1 and W2 is considered, based on the manufacturing process. The AF cost is associated with the correctness of the assist-feature and is more important if the etch process is better controlled and has less through-pitch variation than the lithography process. Conversely, the EDCost is associated with etch dummy correction and it is more important if the lithographic process window is large. In an embodiment of the present invention, the maximum perturbation of a cell is also restricted. For example, let SRCH denote the number of neighboring placement sites by which a cell can be adjusted. The range of the cell $C_{a,j}$ in which it can be adjusted is the range of placement site ($X_{a-1}$–SRCH, $X_{a-1}$+SRCH).

The following pseudo code can be used to calculate the AFCost (a, b, a–1, i) and EDCost (a, b, a–1, i):

Input:

$C_{ff}$ is a user-defined weight for overlapping field polysilicon shapes;

$C_{gg}$ is a user-defined weight for overlapping gate polysilicon shapes;

$C_{gf}$ is a user-defined weight for overlapping between the gate polysilicon shape and the field polysilicon shape;

$C_{ge}$ is a user-defined weight for overlapping between the gate polysilicon shape to the etch dummy;

$C_{fe}$ is a user-defined weight for overlapping between the field polysilicon shape to the etch dummy;

b is a left coordinate of cell $C_{a,j}$;

i is a left coordinate of cell $C_{a-1,j}$;

$w_a$ is the width of cell $C_{a,j}$;

$w_a$ is the width of cell $C_{a-1,j}$;

AFspace (h, k) is the horizontal spacing between $RP_{a-1,j}{}^h$ and $LP_{a,j}{}^k$;

ESspace (h, k) is the horizontal spacing between $RA_{a-1}{}^h,j$ and $LA_{a,j}{}^k$;

AFslope (j) is the delta-resist CD difference over the delta pitch between $AF_j$ and $AF_{j+1}$;

EDslope (j) is the delta-resist CD difference over the polysilicon shape and the etch dummy space;

$DS_l$ and $DS_r$ are the left and right spacing between the etch dummies to active-layer shapes in the left and right cells $C_{a-1,j}$ and $C_{a,j}$ respectively;

$O_{gg}$, $O_{gf}$ Off corresponds to the length of the overlap between polysilicon gate-to-gate, the gate polysilicon shape-to-field polysilicon shape, and the field polysilicon shape-to field polysilicon shape, respectively; and $O_{ge}$, $O_{fe}$ corresponds to the length of the overlap between the gate polysilicon shape-to-etch dummy and the field polysilicon shape-to-etch dummy respectively.

Output:

Value of AFCost (a, b, a–1, i) and EDCost (a, b, a–1, i)

Algorithm:

01. Case a =1: AFCost (1, b) and EDCost (1, b) = 0
02. Case a>1 Do
03. Determine J: = cardinality of set $RP_{a-1}$ right polysilicon shape group of cell $C_{a-1,j}$
04. L: = cardinality of set $LP_a$, left polysilicon shape group of cell $C_{a,j}$ -continued

```
/* calculate overlap weight between RP_h^{a-1} and LP_k^a */
05. For (h = 1; h = J; h = h + 1){
06.     For (k = 1; k = L; k = k + 1){
07.        If (AFspace (k, g) < ED_1){
08.        AFweight (h, k) = AFslope (j)*(AFspace (h, k) – AF_j)*(C_{ff}O_{ff}(h, k) +
              C_{gf}O_{gf}(h, k) + C_{gg}O_{gg}(h, k)); where AF_{j+1} > AFspace (h, k) ≧ AF_j
09.        EDweight (h, k) = EDslope (AFspace (h, k))*(C_{ge}O_{ge}(h, k) +
              C_{fe}O_{fe}(h, k));
           }
10.        Else {
11.        AFweight (h, k) = AFslope (j)*(AW_l(h, k) +
              DS_l(h, k) – AF_j)*(C_{ge}O_{ge}(h, k) +
              C_{fe}O_{fe}(h, k))
12.        AFweight (h, k) = AFslope (j)*(AW_r(h, k) + DS_r(h, k) –
              AF_j)*(C_{ge}O_{ge}(h, k) +
              C_{fe}O_{fe}(h, k))
13.        EDweight (h, k) = (EDslope (AW_l(h, k) + DS_l(h, k)) +
              EDslope (AW_r(h, k) +
              DS_r(h, k)))*(C_{ge}O_{ge}(h, k) + C_{fe}O_{fe}(h, k))}
14.        AF cost (a, b, a–1, i) = AF cost (a, b, a–1, i) + AFweight (h, k)
15.        ED cost (a, b, a–1, i) = ED cost (a, b, a–1, i) + AFweight (h, k)
        }
    }
```

The terms AFslope (j)*(AFspace (h, k)–AF_j) and EDslope (AFspace (h, k)) are a measure of the variation of CD between the polysilicon shapes and the etch dummies. The term ($C_{ff}O_{ff}$ (h, k)+$C_{gf}O_{gf}$(h, k)+$C_{gg}O_{gg}$(h, k)) is a first overlapping factor that accounts for a field polysilicon shape-to-field polysilicon shape overlap, a gate polysilicon shape-to-field polysilicon shape overlap, and a gate polysilicon shape-to-gate polysilicon shape overlap. $C_{ff}$, $C_{gf}$, and $C_{gg}$ are used to weigh the overlap based on the printability of the gate polysilicon shapes and field polysilicon shapes. The term ($C_{ge}O_{ge}$(h, k)+$C_{fe}O_{fe}$(h, k)) is a second overlapping factor that accounts for a gate polysilicon shape-to-etch dummy overlap, and a field polysilicon shape-to-etch dummy overlap. $C_{ge}$ and $C_{fe}$ are used to weigh the overlap based on the printability of the polysilicon shapes and the etch dummy.

The above-given method can be used to adjust the spacing between the cells of a standard-cell layout, such that etch dummies can be inserted and the number of forbidden pitches is reduced. The method can be utilized to create a modified standard-cell layout from a standard-cell layout obtained from an Electronic Design Automation (EDA) tool. In another embodiment, the above-given method can be embodied in an EDA tool such that the standard-cell layout generated by the EDA tool has improved photolithographic characteristics.

Figure 8:
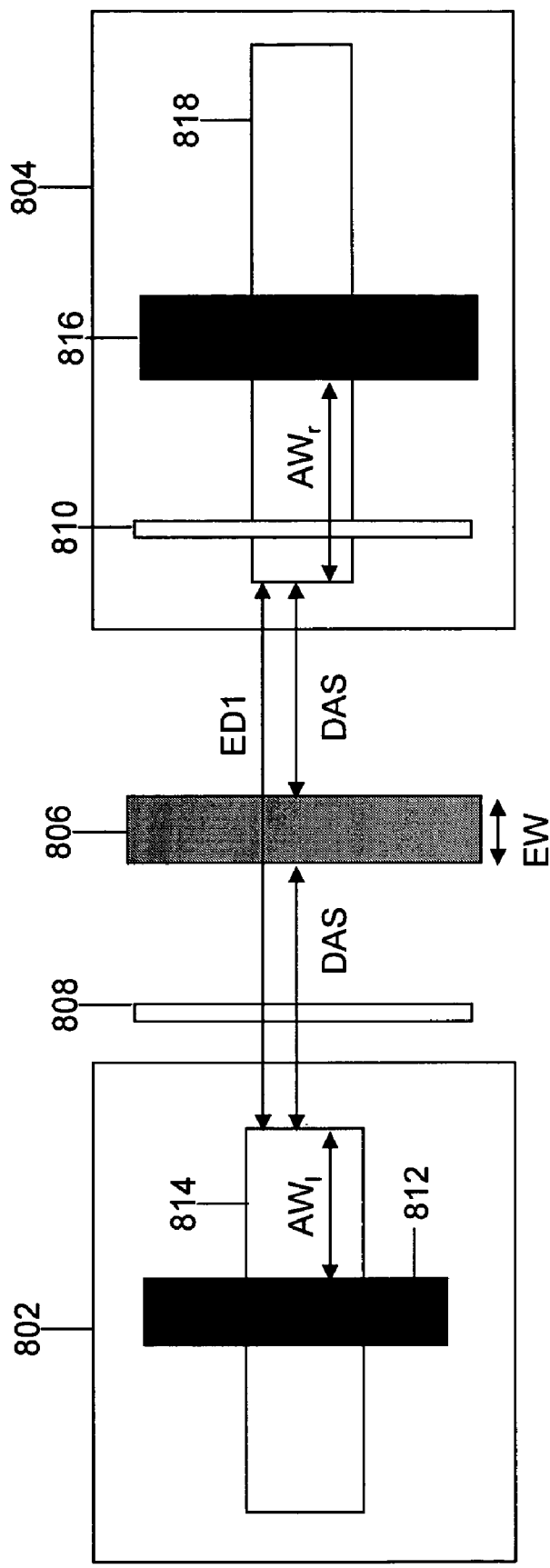
FIG. 8 is a schematic diagram illustrating an exemplary sub-resolution assist feature (SRAF)-aware etch dummy insertion technique, in accordance with an embodiment of the present invention.

FIG. 8 is a schematic diagram illustrating an exemplary sub-resolution assist feature (SRAF)-aware etch dummy insertion technique, in accordance with an embodiment of the present invention. In FIG. 8, a cell 802, a cell 804, an etch dummy 806, an SRAF 808, and an SRAF 810 are shown. Cell 802 includes a polysilicon shape 812 and an active-layer shape 814. Similarly, cell 804 includes a polysilicon shape 816 and an active-layer shape 818. Etch dummy 806 is to be inserted between polysilicon shapes 812 and should be placed outside the active-layer shapes of the polysilicon shapes. Typically, a maximum of two etch dummies are required to reduce the CD skew in the photo and etch processes. However, for the purpose of this description, only one etch dummy is shown in FIG. 8. Let DAS denote the spacing required between etch dummy 806 and active-layer shapes 814 and 818. Similarly, let DDS denote the spacing required between the two etch dummies if two dummies are to be inserted. Further, let EW denote the width of etch dummy 806. Let ED1 and ED2 denote the spacing required for the insertion of one etch dummy and two etch dummies, respectively. Typically, etch dummies are inserted such that they are distributed evenly in the space between the active-layer shapes. Therefore, ED1 is equal to 2*DAS+EW. Similarly, ED2 is equal to 2*DAS+2*EW+DDS. In other words, the first etch dummy is inserted in the center of the spacing between the two active-layer shapes belonging to different cells in a cell row. Similarly, the second etch dummy can be placed according to the available DAS. However, the spacing between the etch dummies inserted according to this method can be inappropriate for the insertion of SRAFs. In accordance with various embodiments of the present invention, the spacing between the polysilicon shape and the etch dummy is adjusted to convert it to an assist-correct spacing selected from AF.

When the method described in FIG. 5 is followed for etch dummy 806 in the standard-cell layout, etch dummy 806 can be adjusted to make the spacing between polysilicon shapes 812 and 816 and etch dummy 806 into an assist-correct spacing, to accommodate SRAFs such as SRAFs 808, and 810. This method is referred to as SRAF-aware etch dummy insertion. In FIG. 8, let $AW_l$ denote the width of active-layer shape 814, which is outside polysilicon shape 812 and towards the right outline of cell 802. Similarly, let $AW_r$ denote the width of active-layer shape 818, which is outside polysilicon shape 816 and towards the left outline of cell 802. Let $AS_l$ denote a perturbation of spacing required to make the spacing between polysilicon shape 812 and etch dummy 806 an assist-correct spacing. Similarly, let $AS_r$ denote a perturbation of spacing required to make the spacing between polysilicon shape 816 and etch dummy 806 an assist-correct spacing. The values of $AS_l$ and $AS_r$ are calculated as follows:

Minimize index value of j and k in AF such that
$AS_l = AF_j - (AW_l + DAS)$, and $AS_r = AF_k - (AW_r + DAS)$; and $(AS_l + AS_r) \leq (ES - ED_1)$ The above-given method calculates the minimum extra spaces required ($AS_l$ and $AS_r$) to make the spacing into an assist-correct spacing. The minimum index assist-correct value is taken to adjust the extra spaces of $AS_l$ and $AS_r$, in the available spacing (ES–ED1). Etch dummy 806 is adjusted according to $AS_l$ and $AS_r$, from its initial position, to make the spacing between the polysilicon shape and the etch dummy an assist-correct and etch-correct spacing.

Figure 9:
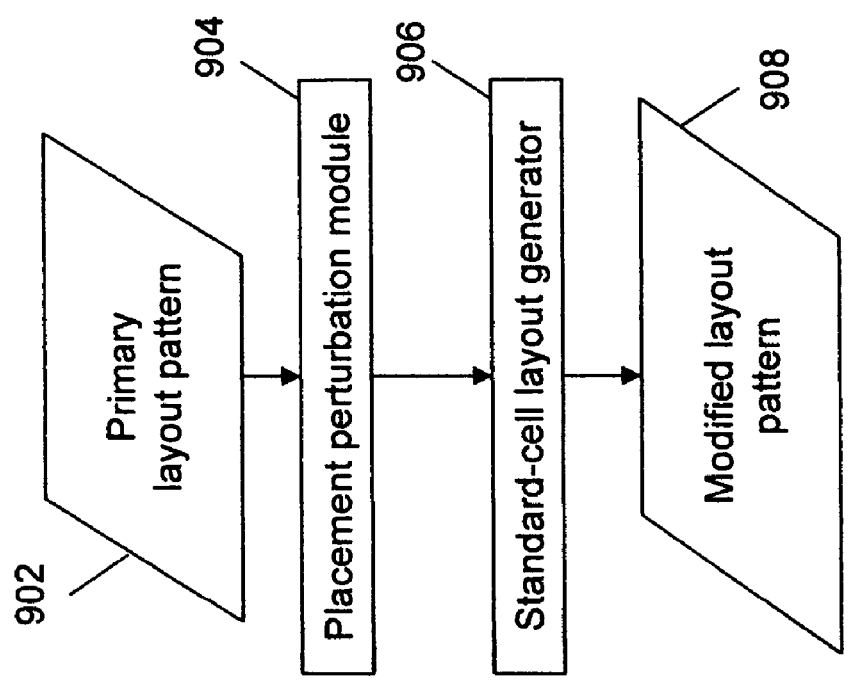
FIG. 9 is a block diagram of a system for the detailed placement of layout objects in a standard-cell layout design, in accordance with an embodiment of the present invention.

FIG. 9 is a block diagram of a system for the detailed perturbed placement of layout objects in a standard-cell layout design, in accordance with an embodiment of the present invention. In FIG. 9, a primary layout pattern 902, a placement perturbation module 904, a standard-cell layout generator 906, and a modified layout pattern 908 are shown. Primary layout pattern 902 includes a plurality of layout objects and the SRAFs of the standard-cell layout. It will be apparent to those skilled in the art that the primary layout pattern 902 could also include other necessary features. Placement perturbation module 904 takes primary layout pattern 902 of the standard-cell layout as an input. Primary layout pattern 902 can include forbidden pitches. Further, it can have critical dimension (CD) errors between its layout objects. The occurrence of forbidden pitches and CD errors can be due to the incorrect placement of layout objects in primary layout pattern 902. Placement perturbation module 904 calculates the placement perturbation distance between the plurality of layout objects in the primary layout pattern 902, and the layout pattern is thereafter modified. In an embodiment of the invention, the system further includes a cost minimizer. The cost minimizer determines a placement site in the standard-cell layout at which the cost of placing the cell is minimum. The cost minimizer minimizes the cost based on the variation of CD between polysilicon shapes and etch dummies, the first overlapping factor, and the second overlapping factor. The algorithms used by cost minimizer are described in conjunction with FIG. 5. In accordance with another embodiment of the invention, the system can also include a memory that can store the set of assist-correct spacings that are required as an input for the algorithms. The memory can also store other inputs required for the algorithm. The placement perturbation distance between the plurality of layout objects is given to the standard-cell layout generator module 906. Standard-cell layout generator module 906 adjusts each of the plurality of layout objects according to their placement perturbation distance. Modified layout pattern 908 of the standard-cell layout is obtained after the adjustment of the plurality of layout objects. Modified layout pattern 908 has a reduced number of CD errors and fewer forbidden pitches, as compared to primary layout pattern 902.

Figure 10:
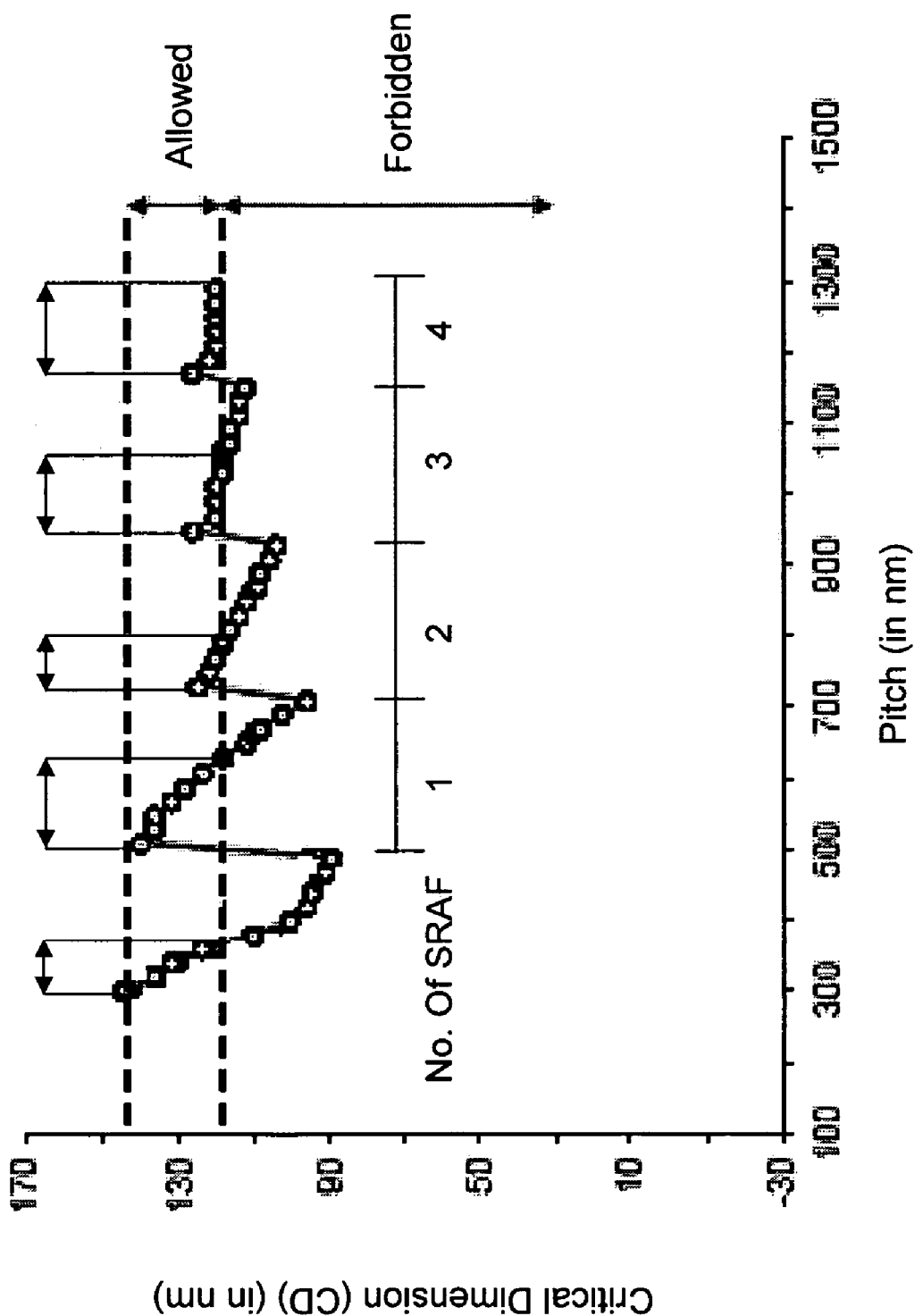
FIG. 10 is a graph illustrating exemplary values for assist-correct spacings.

FIG. 10 is a graph illustrating exemplary values for set of assist-correct spacings (AF) between poly shapes in different cells or between etch dummies and poly shapes in a cell. The graph representatively illustrates the variation of critical dimension (CD) with pitch. As seen in the graph, with certain pitches the corresponding value of CD is allowed. These pitches are marked by arrows and can be selected to form part of AF. For other pitches, the values of CDs fall below the required thresholds. These pitches are termed as forbidden pitches. As the pitch is increased, the value of CDs enters the forbidden region. However, as soon as the pitch increases an SRAF can be inserted (denoted by No. of SRAF=1) which causes the CD to return to the allowed region. Such values of pitch for which the CD returns to the allowed region can also be selected to form a part of AF. A similar pattern is repeated till more SRAFs cannot be added, leading to the saw-tooth pattern as seen in FIG. 10. The slopes of the sections of the graph that represent reduction in CD are used to calculate the variation of CD with pitch, as required in the algorithms described in conjunction with FIG. 5.

Various embodiments of the present invention offer the following advantages. Standard-cell layouts prepared in accordance with various embodiments of the present invention have improved photolithography characteristics. Errors in CD and the number of forbidden pitches are reduced. This is because an increased number of etch dummies and SRAFs can be inserted in the standard-cell layout. Further, the value of SRCH can be selected such that the run-times of the algorithms in accordance with various embodiments of the present invention do not increase the time for preparing the standard-cell layout substantially. The values of various input constants, such as α and β, can be selected to achieve a balance between the number of remaining horizontal and vertical forbidden pitches.

The system for detailed placement of layout objects in a standard-cell layout design, as described in the present invention, or any of its components, may be embodied in the form of a computer system. Typical examples of a computer system includes a general-purpose computer, a programmed microprocessor, a micro-controller, a peripheral integrated circuit element, and other devices or arrangements of devices that are capable of implementing the steps that constitute the method of the present invention.

The computer system comprises a computer, an input device, a display unit and the Internet. Computer comprises a microprocessor. Microprocessor is connected to a communication bus. Computer also includes a memory. Memory may include Random Access Memory (RAM) and Read Only Memory (ROM). Computer system further comprises storage device. It can be a hard disk drive or a removable storage drive such as a floppy disk drive, optical disk drive and the like. Storage device can also be other similar means for loading computer programs or other instructions into the computer system.

The computer system executes a set of instructions that are stored in one or more storage elements, in order to process input data. The storage elements may also hold data or other information as desired. The storage element may be in the form of an information source or a physical memory element present in the processing machine. Exemplary storage elements include hard disk, DRAM, SRAM and EPROM. The storage element may also be external to the computer system, and connected to or inserted into the computer for download at or prior to the time of use. Exemplary of such external computer program products are computer readable storage mediums such as CD-ROMs, Flash chips, floppy disks, and the like.

The set of instructions may include various commands that instruct the processing machine to perform specific tasks such as the steps that constitute the method of the present invention. The set of instructions may be in the form of a software program. The software may be in various forms such as system software or application software. Further, the software might be in the form of a collection of separate programs, a program module with a larger program or a portion of a program module. The software might also include modular programming in the form of object-oriented programming. The software program containing the set of instructions can be embedded in a computer program product for use with a computer, the computer program product comprising a computer usable medium having a computer readable program code embodied therein. The processing of input data by the processing machine may be in response to user commands, or in response to results of previous processing or in response to a request made by another processing machine.

While the foregoing is directed to embodiments of the present invention, other and further embodiments of the invention may be devised without departing from the basic scope thereof, and the scope thereof is determined by the claims that follow. Additional discussion regarding placement perturbation between cells and features are discussed in the following articles written by the inventors, the content of those articles incorporated herein by reference: Gupta P., Kahng A. B. and Park C.-H "Detailed Placement for Improved Depth of Focus and CD Control", Proc. Asia and South Pacific Design Automation Conf., published on or about Jan. 18, 2005, pp. 343-348, and Gupta P., Kahng, A. B. and Park C.-H, "Enhanced Resist and Etch CD Control by Design Perturbation", Proc 25$^{th}$ BACUS Symposium on Photomask Technology and Management, October 2005 (not yet published).

The invention claimed is:

1. A computer-implemented method for placing a plurality of layout objects in a standard-cell layout, wherein the plurality of layout objects comprises at least one cell, the standard-cell layout comprising a plurality of placement sites, the method comprising:

determining a cost function for the at least one cell based on interactions between the plurality of layout objects, wherein the cost function is a measure of cost for placing the at least one cell at a placement site;

calculating a layout object perturbation distance of the at least one cell based on the cost function, wherein the layout object perturbation distance is the change in location of the at least one cell;

adjusting the at least one cell by the layout object perturbation distance; and storing the adjusted at least one cell in a memory;

wherein the at least one cell comprises at least one polysilicon shape, wherein the at least one polysilicon shape is formed by a combination of at least one gate polysilicon shape and at least one field polysilicon shape; and wherein the step of calculating the layout object perturbation distance comprises determining a perturbation of spacing required for making the spacing between a first polysilicon shape contained in the plurality of layout objects and an adjacent second polysilicon shape contained in the plurality of layout objects into an assist-correct spacing, wherein the assist-correct spacing is an allowed spacing between adjacent layout objects.

2. The method according to claim 1, wherein the assist-correct spacing is selected from a set of assist-correct spacings.

3. The method according to claim 1, wherein the step of determining the cost function comprises determining a cost for placing the at least one cell in at least one neighboring placement site.

4. The method according to claim 1, wherein the step of determining the cost function further comprises determining a cost for changing a position of the at least one cell.

5. The method according to claim 1, wherein the step of determining the cost function comprises at least one of:
   determining a first overlapping factor, where the first overlapping factor accounts for overlap between polysilicon shapes of adjacent cells; and
   determining a variation in critical dimensions over a spacing between the polysilicon shapes in adjacent cells and an assist-correct spacing.

6. The method according to claim 5, wherein the first overlapping factor accounts for at least one of: a gate polysilicon shape-to-gate polysilicon shape overlap, a gate polysilicon shape-to-field polysilicon shape overlap, and a field polysilicon shape-to-field polysilicon shape overlap.

7. The method according to claim 5, further comprising weighting the first overlapping factor based on the printability of components of the polysilicon shapes.

8. The method according to claim 5, wherein the step of determining the cost function further comprises:
   determining a second overlapping factor, wherein the second overlapping factor accounts for overlap between at least one polysilicon shape of the at least one cell and at least one etch dummy; and
   determining a variation in critical dimension over spacing between the at least one polysilicon shape of the at least one cell and the at least one etch dummy.

9. The method according to claim 8, wherein the second overlapping factor accounts for at least one of: a gate polysilicon shape-to-etch dummy overlap, and a field polysilicon shape-to-etch dummy overlap.

10. The method according to claim 8, further comprising weighting the second overlapping factor based on the printability of components of the at least one polysilicon shape.

11. The method according to claim 1, wherein the plurality of layout objects comprises at least one etch dummy.

12. The method according to claim 11, wherein the step of calculating the layout object perturbation distance comprises:
   determining a perturbation of spacing required for making the spacing between the etch dummy and an adjacent layout object into an assist-correct spacing.

13. The method according to claim 1, further comprising the step of generating a modified standard cell layout.

14. The method according to claim 1, wherein the method is embodied in an Electronic Design Automation tool.

15. The method according to claim 1, wherein the step of determining the cost function further comprises determining the cost function for the at least one cell based on interactions between two or more cells of the at least one cell.

16. The method according to claim 1, wherein the interactions between the layout objects are based on a distance between the plurality of layout objects and an overlap between the plurality of layout objects.

17. The method according to claim 1, wherein the cost function is determined based on relative importance of preserving initial location of the at least one cell in the standard cell layout.

18. A computer-implemented method for placing a plurality of layout objects in a standard-cell layout, wherein the plurality of layout objects comprises at least one cell, the standard-cell layout comprising a plurality of placement sites, the method comprising:
   determining a cost function for the at least one cell based on interactions between the plurality of layout objects, wherein the cost function is a measure of cost for placing the at least one cell at a placement site;
   calculating a layout object perturbation distance of the at least one cell based on the cost function, wherein the layout object perturbation distance is the change in location of the at least one cell;
   adjusting the at least one cell by the layout object perturbation distance; and
   storing the adjusted at least one cell in a memory;
wherein the at least one cell comprises at least one polysilicon shape, wherein the at least one polysilicon shape is formed by a combination of at least one gate polysilicon shape and at least one field polysilicon shape;
   wherein the step of calculating the layout object perturbation distance comprises determining a perturbation of spacing required for making the spacing between a selected layout object and an etch dummy into an assist-correct spacing and an etch-correct spacing, wherein the etch-correct spacing is an allowed spacing between the selected layout object and the etch dummy; and wherein all of the operations of the method are executed by a microprocessor.

19. A system for placing a plurality of layout objects in a standard-cell layout, wherein the plurality of layout objects comprises at least one cell, the standard-cell layout comprising a plurality of placement sites, the system comprising:
   a cost function module for determining a cost function for the at least one cell based on interactions between the plurality of layout objects, wherein the cost function is a measure of cost for placing the at least one cell at a placement site;
   a placement perturbation module for calculating a layout object perturbation distance of the at least one cell based on the cost function, wherein the layout object perturbation distance is the change in location of the at least one cell; and
   a standard-cell layout generator module for adjusting the at least one cell by the layout object perturbation distance;
   wherein the at least one cell comprises at least one polysilicon shape, wherein the at least one polysilicon shape is formed by a combination of at least one gate polysilicon shape and at least one field polysilicon shape;
   wherein the layout object perturbation distance equals a difference between an assist-correct spacing and a spacing between a polysilicon shape in the at least one cell and a polysilicon shape in an adjacent cell, wherein the assist-correct spacing is an allowed spacing between adjacent layout objects.

20. The system according to claim 19, wherein the layout object perturbation distance equals a difference between
   an assist-correct spacing and
   a spacing between a polysilicon shape in the at least one cell and an etch dummy.

21. The system according to claim 19 further comprising a cost minimizer, the cost minimizer determining a placement site in the standard-cell layout at which the cost of placing the at least one cell is minimum.

22. The system according to claim 21, wherein the cost minimizer determines the cost based on at least one of:
   a first overlapping factor, wherein the first overlapping factor accounts for overlap between polysilicon shapes of adjacent cells; and
   a variation in critical dimensions over a spacing between the polysilicon shapes in the adjacent cells and an assist-correct spacing; and
   a cost of changing a position of the at least one cell.

23. The system according to claim 22, wherein the first overlapping factor includes at least one of: a gate polysilicon shape-to-gate polysilicon shape overlap, a gate polysilicon shape-to-field polysilicon shape overlap, and a field polysilicon shape-to-field polysilicon shape overlap.

24. The system according to claim 22, wherein the first overlapping factor is weighted based on the printability of components of the polysilicon shapes.

25. The system according to claim 22, wherein the cost minimizer further determines the cost based on at least one of:
   a second overlapping factor, wherein the second overlapping factor accounts for overlap between at least one polysilicon shape of the at least one cell and at least one etch dummy; and
   a variation in critical dimension over spacing between the at least one polysilicon shape in the at least one cell and the at least one etch dummy.

26. The system according to claim 25, wherein the second overlapping factor includes at least one of: a gate polysilicon shape-to-etch dummy overlap, and a field polysilicon shape-to-etch dummy overlap.

27. The system according to claim 25, wherein the second overlapping factor is weighted based on the printability of components of the at least one polysilicon shape and the at least one etch dummy.

28. The system according to claim 19, wherein the at least one layout object further comprises an etch dummy.

29. The system according to claim 28, wherein the at least one layout object perturbation distance equals a difference between
   an assist-correct spacing and
   a distance between the etch dummy and an adjacent layout object.

30. The system according to claim 19 further comprising a memory, the memory storing a set of assist-correct spacings.

31. A computer program product for use with a computer, the computer program product comprising a computer usable medium having a computer readable program code embodied therein for placing a plurality of objects in a standard-cell layout, wherein the plurality of layout objects comprises at least one cell, the standard-cell layout comprising a plurality of placement sites, the computer program code performing the steps of:
   determining a cost function for the at least one cell based on interactions between the plurality of layout objects, wherein the cost function is a measure of cost for placing the at least one cell at a placement site;
   calculating a layout object perturbation distance of the at least one cell, based on the cost function, wherein the layout object perturbation distance is the change in location of the at least one cell; and
   adjusting the at least one cell by the layout object perturbation distance;
   wherein the step of calculating the layout object perturbation distance comprises determining a perturbation of spacing required for making the spacing between a selected layout object and an etch dummy into an assist-correct spacing and etch-correct spacing, wherein the etch-correct spacing is an allowed spacing between the selected layout object and the etch dummy.

32. The computer program product of claim 31, wherein the at least one cell comprises at least one polysilicon shape, wherein the at least one polysilicon shape is formed by a combination of at least one gate polysilicon shape and at least one field polysilicon shape.

33. The computer program of claim 31, wherein the step of calculating the layout object perturbation distance comprises determining a perturbation of spacing required for making the spacing between a first layout object and an adjacent second layout object into an assist-correct spacing, wherein the assist-correct spacing is an allowed spacing between adjacent layout objects.

34. The computer program product of claim 33, wherein the assist-correct spacing is selected from a set of assist-correct spacings.

35. The computer program product of claim 31, wherein the step of determining the cost function comprises determining a cost for placing the at least one cell in at least one neighboring placement site.

36. The computer program product of claim 31, wherein the step of determining the cost function further comprises determining a cost for changing a position of the at least one cell.

37. The computer program product of claim 31, wherein the step of determining the cost function comprises at least one of:
   determining a first overlapping factor, wherein the first overlapping factor accounts for overlap between polysilicon shapes of adjacent cells; and
   determining a variation in critical dimensions over a spacing between the polysilicon shapes in adjacent cells and an assist-correct spacing.

38. The computer program product of claim 37, wherein the first overlapping factor accounts for at least one of: a gate polysilicon shape-to-polysilicon gate overlap, a gate polysilicon shape-to-field polysilicon shape overlap, and a field polysilicon shape-to-field polysilicon shape overlap.

39. The computer program product of claim 37, further comprising weighting the first overlapping factor based on the printability of components of the polysilicon shapes.

40. The computer program product of claim 37, wherein the step of determining the cost function further comprises:
   determining a second overlapping factor, wherein the second overlapping factor accounts for overlap between at least one polysilicon shape of the at least one cell and at least one etch dummy; and
   determining a variation in critical dimension over spacing between the at least one polysilicon shape in the at least one cell and the at least one etch dummy.

41. The computer program product of claim 40, wherein the second overlapping factor accounts for at least one of: a gate polysilicon shape-to-etch dummy overlap, and a field polysilicon shape-to-etch dummy overlap.

42. The computer program product of claim 40, further performing weighting the second overlapping factor based on the printability of components of the at least one polysilicon shape.

* * * * *